United States Patent
Uchikoba et al.

(10) Patent No.: US 6,483,763 B2
(45) Date of Patent: Nov. 19, 2002

(54) SEMICONDUCTOR MEMORY DEVICE

(75) Inventors: Toshitaka Uchikoba, Hyogo (JP); Kiyoto Ohta, Osaka (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 09/942,947

(22) Filed: Aug. 31, 2001

(65) Prior Publication Data

US 2002/0036940 A1 Mar. 28, 2002

(30) Foreign Application Priority Data

Aug. 31, 2000 (JP) ........................... 2000-262776

(51) Int. Cl.[7] .............................. G11C 7/00; G11C 5/06; G11C 5/14
(52) U.S. Cl. ...................... 365/205; 365/51; 365/63; 365/226
(58) Field of Search ................. 365/205, 207, 365/208, 226, 51, 63

(56) References Cited

U.S. PATENT DOCUMENTS

| | | | |
|---|---|---|---|
| 4,807,194 A | 2/1989 | Yamada et al. | ............ 365/207 |
| 4,948,993 A | 8/1990 | Chin et al. | ............ 365/205 |
| 5,222,038 A | 6/1993 | Tsuchida et al. | ............ 365/204 |
| 5,293,559 A * | 3/1994 | Kim et al. | ............ 365/63 |
| 5,321,646 A * | 6/1994 | Tomishima et al. | ............ 365/51 |
| 5,321,658 A * | 6/1994 | Ishimura et al. | ............ 365/206 |
| 5,422,853 A * | 6/1995 | Miyamoto | ............ 365/205 |
| 5,519,650 A * | 5/1996 | Ichimura et al. | ............ 365/63 |
| 5,867,440 A * | 2/1999 | Hidaka | ............ 365/226 |

FOREIGN PATENT DOCUMENTS

JP  5-62461  3/1993

* cited by examiner

Primary Examiner—Son Mai
(74) Attorney, Agent, or Firm—McDermott, Will & Emery

(57) ABSTRACT

Each of a plurality of sense amplifiers in a sense amplifier drive circuit of a DRAM includes a PMOS sense amplifier drive transistor and an NMOS sense amplifier drive transistor. The source of each of the PMOS sense amplifier drive transistors is connected to a first common power line and to multiple independent power lines orthogonal thereto. The source of each of the NMOS sense amplifier drive transistors is connected to a first common power line and to multiple independent power lines orthogonal thereto. Therefore, charging current and discharging current are distributed to the multiple power lines arranged in mesh-like pattern. Therefore, in sensing operations, the charging and the discharging currents in bit lines are distributed so that interference between the sense amplifiers can be suppressed and the data read-out speed can be increased.

10 Claims, 6 Drawing Sheets

SEMICONDUCTOR MEMORY DEVICE

BACKGROUND OF THE INVENTION

The present invention relates to a semiconductor memory device such as a dynamic random access memory (DRAM), and more specifically to an improved sense amplifier drive circuit thereof.

In general, a DRAM stores a small electric charge in a section referred to as a memory cell, and holds an electric charge as data of logic "1" or data of logic "0". The memory cells are arranged in an array. Any memory cell can be selected by inputting a row address and a column address externally. The row address is decoded by a row decoder to select any bit line pair, whereas the column address is decoded by a column decoder to select any word line. The memory cell is located at each intersecting point of the word lines and the bit lines.

In a data read-out operation, an arbitrary word line is activated, whereby data with a small electric charge in all the memory cells connected to the word line are read out in respective bit lines connected to the memory cells, and amplified by sense amplifiers connected to the bit lines. To amplify the data with a sense amplifier, two bit lines, i.e., a bit line pair is required because a potential of a bit line in which data is not read out is used as a reference potential.

A read-out operation includes the operations of selecting any bit line pair from a plurality of bit line pairs for which an amplifying operation has been performed by a sense amplifier, extracting data from the selected bit line pair into a global data line, further amplifying the data with a main amplifier and transmitting the data to the outside of the DRAM through an interface.

The present invention is directed, in particular, to a drive circuit of the sense amplifier, among the elements constituting a DRAM.

A typical example of a conventional sense amplifier drive circuit will be described with reference to FIG. 6. In FIG. 6, MA is a memory array that has multiple memory cells MC arranged in an array. WL is a word line, and BL106 and /BL107 are bit lines. SA101 is a CMOS sense amplifier that has an NMOS amplifier 108 having two NMOS transistors N1 and N2, and a PMOS amplifier 109 having two PMOS transistors P1 and P2. QSDN102 is an NMOS sense amplifier drive transistor, which turns on when it receives a sense amplifier activating signal SAN at the gate thereof and connects a grounding power line VSS to the source of the NMOS amplifier 108. QSDP103 is a PMOS sense amplifier drive transistor, which turns on when it receives a sense amplifier activating signal SAP at the gate thereof and connects a power line VDD of a predetermined potential to the source of the PMOS amplifier 109. Both reference numerals 104 and 105 are sense amplifier driving lines, each of which has a wiring resistance r. A plurality of CMOS sense amplifiers SA are connected in parallel to these sense amplifier driving lines 4 and 5. Hereinafter, the operations of the sense amplifier drive circuit will be described briefly.

When a word line WL is activated, a small potential of a memory cell MC connected to the word line WL is read out in one bit line of a bit line pair consisting of the bit lines BL106 and /BL107 that are precharged to the midpoint potential (potential that is a half of a predetermined potential of the power line VDD). Then, when the sense amplifier drive transistors QSDN102 and QSDP103 are turned on by the sense amplifier activating signals SAN and SAP, respectively, the sensing operation starts in the sense amplifier SA. By means of this operation, the other bit line of the bit line pair is charged to a predetermined potential by the PMOS sense amplifier drive transistor QSDP103, whereas the other bit line is discharged to a ground potential by the NMOS sense amplifier drive transistor QSDN102. By means of this operation, a small potential of a memory cell MC can be amplified. Furthermore, in this amplifying operation, the charging current flows into the sense amplifier driving line 105 and the discharging current flows into the sense amplifier driving line 104.

However, in the conventional sense amplifier drive circuits having a configuration in which the charging or the discharging current from multiple sense amplifiers SA101 concentrates on one sense amplifier driving line 104 or 105, a significant voltage drop occurs because of the wiring resistance r of the sense amplifier driving lines 104 and 105 themselves, and it takes a long time to charge and discharge the bit lines BL106 and /BL107. As a result, the data readout speed may be reduced, or data may not be read out correctly.

A cause of this problem will be described by taking the operation of the NMOS amplifier 108 side as an example. (Herein, since the PMOS amplifier 109 side is symmetrical to the NMOS amplifier 108 side with regard to the principle of the operation, description thereof will be omitted.) When a word line WL is activated and a small potential is read out from an arbitrary memory cell MC of the memory cell array MA into one bit line of a bit line pair (e.g., BL106), then sense amplifier activating signals SAP and SAN allow the sense amplifier drive transistors QSDN102 and QSDP103 to turn on, respectively, so as to activate a sense amplifier SA101, and the amplifying operation starts.

At this time, when the PMOS amplifier 109 turns on and the potential of the bit line BL106 increases, the gate potential of the NMOS transistor N2 of the NMOS amplifier 108 connected to the bit line BL106 increases. Therefore the impedance of the NMOS transistor N2 becomes low and allows more current to flow therethrough. As a result, when the current flowing from the other bit line /BL107 that makes a pair with the bit line BL106 into the sense amplifier driving line 104, i.e., the discharging current becomes higher than the current capacity of the sense amplifier drive transistor QSDN102, or when a voltage drop caused by the wiring resistance r of the sense amplifier driving line 104 is significant, a source potential (bottom potential) of the NMOS amplifier 108 rises and floats. Accordingly, a voltage Vgs between the gate and the source of the NMOS transistor N2 of the NMOS amplifier 108 becomes low, and therefore, the current capacity of the NMOS transistor N2 drops and it takes a long time to discharge. As a result, the data amplifying operation takes longer time and the read-out speed is reduced, and thus the data can not be read out correctly.

Furthermore, when some transistors among the NMOS transistors N1 and N2 of the sense amplifier SA101 have a higher threshold voltage due to non-uniformity during the manufacturing process, it becomes more difficult for these NMOS transistors to be ensured the threshold voltage because of the increase of the source potential. Therefore, the operation of turning the NMOS transistor on becomes even slower and the data read-out speed is reduced more significantly.

The reduction in the read-out speed due to floating of the source potential of the NMOS amplifier 108 can occur in the following cases. For example, the read-out speed depends on the pattern of data to be read out (which indicates in the read-out operation what data is read out in each of the multiple bit line pairs that are subjected to the read-out operation), and the speed at which the sensing operation is performed varies depending on the pattern. The pattern resulting in the lowest operation speed is to read out "0" from one bit line pair and data "1" from all of the remaining bit line pairs. More specifically, the bit line from which "1" is read out has a precharge potential+.V of a small voltage at the beginning of the amplifying operation. This voltage provides the gate potential for one of the NMOS transistors N1 and N2 of the sense amplifier, and discharge is performed by this transistor. On the other hand, in the bit line pair from which "0" is read out, discharge is performed by the transistor having the gate provided with the precharge potential serving as a reference potential. Thus, the gate voltage of the transistor for discharge is higher when "1" is read out. Therefore, the sense amplifier SA101 that reads out "1" starts the sensing operation earlier than the sense amplifier SA101 that reads out "0". Then, since the source potential floats because of the discharging current, the voltage Vgs between the gate and the source of the NMOS transistor N1 or N2 of the sense amplifier SA101 that reads out "0" becomes lower, and thus, the current capacity decreases and it takes a long time to discharge.

As described above, when the sense amplifier driving lines 104 and 105 are common, the sense amplifier SA101 interferes with each another, which causes difficulties in speeding up the sensing operation.

Furthermore, conventionally, Japanese Laid-Open Patent Publication (Tokkai) No. 5-62461 discloses a semiconductor memory device having a configuration in which an N- and a P-channel drive transistors are provided for every two of the sense amplifiers and these drive transistors are connected to a power line having a predetermined potential and a power line having a ground potential. Even in this configuration, however, since a power line having a predetermined potential and a power line having a ground potential (sense amplifier driving lines)are also shared by the plurality of sense amplifiers, individual sense amplifiers also interfere with one another and it is difficult to speed up the sensing operation.

SUMMARY OF THE INVENTION

It is an object of the present invention to provide a semiconductor memory device in which a high-speed sensing operation is realized by minimizing interference between sense amplifiers.

In order to achieve this object, in the present invention, a plurality of sense amplifier driving lines are provided instead of one sense amplifier driving line to be shared so that the charging current to multiple sense amplifiers can be supplied dispersively via the plurality of sense amplifier driving lines, and the discharging current from the multiple sense amplifiers can be drained dispersively via the plurality of sense amplifier driving lines.

More specifically, a semiconductor memory device of the present invention includes a plurality of CMOS sense amplifiers each of which including both PMOS and NMOS transistors; a PMOS sense amplifier drive transistor that is provided for every predetermined number of the plurality of CMOS sense amplifiers, connected to sources of PMOS transistors of the corresponding predetermined number of the CMOS sense amplifiers and driven by a sense amplifier driving signal; an NMOS sense amplifier drive transistor that is provided for every predetermined number of the plurality of CMOS sense amplifiers, connected to sources of NMOS transistors of the corresponding predetermined number of the CMOS sense amplifiers and driven by another sense amplifier driving signal; multiple first power lines for supplying a given power source to the plurality of CMOS sense amplifiers through the respective PMOS sense amplifier drive transistors; and multiple second power lines for supplying another given power source to the plurality of CMOS sense amplifiers through the respective NMOS sense amplifier drive transistors.

Moreover, in the semiconductor memory device of the present invention, one PMOS and one NMOS sense amplifier drive transistors are provided for every two of the CMOS sense amplifiers.

Furthermore, in the semiconductor memory device of the present invention, each of the PMOS and the NMOS sense amplifier drive transistors is shared by every two of the CMOS sense amplifiers, and a substrate contact for connecting the first and the second power lines to a substrate is formed near one of the two CMOS sense amplifiers in an area where the sense amplifier drive transistors are not arranged.

In addition, in the semiconductor memory device of the present invention, the multiple first power lines include a first common power line extending in a column direction of the CMOS sense amplifiers and connected to each of the PMOS sense amplifier drive transistors, and multiple first independent power lines connected to the common power line. The multiple second power lines include a second common power line extending in a column direction of the CMOS sense amplifiers and connected to each of the NMOS sense amplifier drive transistors, and multiple second independent power lines connected to the common power line.

Moreover, in the semiconductor memory device of the present invention, each one of the multiple first power lines and each one of the multiple second power lines are provided for every predetermined number of the CMOS sense amplifiers; and one first and one second power lines are used exclusively for the corresponding predetermined small number of the CMOS sense amplifiers.

Furthermore, in the semiconductor memory device of the present invention, each one of the multiple first independent power lines and each one of the multiple second independent power lines are provided for every two of the CMOS sense amplifiers, and between the first independent power line and the second independent power line corresponding to any set of two CMOS sense amplifiers, a global data line to which data amplified by either one of the two CMOS sense amplifiers is output is arranged so as to extend in parallel with the first and the second independent power lines.

In addition, in the semiconductor memory device of the present invention, between the first power source and the second power line that are used exclusively for a predetermined small number of CMOS sense amplifiers, a global data line to which data amplified by any one of the predetermined number of CMOS sense amplifiers is output is arranged so as to extend in parallel with the first and the second independent power lines.

Thus, in the present invention, the charging current charged from a given power source to the CMOS sense amplifiers via the PMOS sense amplifier drive transistors is supplied using multiple first power lines. The discharging current discharged from the CMOS sense amplifiers to the given power source via the NMOS sense amplifier drive transistors is released using multiple second power lines. Therefore, concentration of the charging and the discharging currents as seen in a conventional configuration in which the sense amplifier driving line is shared can be alleviated. As a result, potential rise of each source of the PMOS transistors and the NMOS transistors constituting the CMOS sense amplifiers and interference between the sense amplifiers due to this potential rise can be suppressed effectively so that a high-speed sensing operation can be realized.

In particular, according to the present invention, sense amplifier drive transistors are shared and areas in which these transistors are not arranged can be effectively utilized to form, for example, substrate contacts for the first and the second power lines therein. Thus, extra areas for the substrate contacts and the like are unnecessary and a compact layout can be obtained.

Moreover, the present invention includes power lines used exclusively for every predetermined number of the sense amplifiers, so that charging and discharging currents to the sense amplifiers can be distributed reliably, and therefore, interference between the sense amplifiers can be further minimized and data write speed can be increased more significantly.

Furthermore, according to the present invention, a global data line is located in parallel between the first power line and the second power line so that the global data line can be shielded by these power lines. Therefore, noise caused by interference occurring between the plurality of global data lines can be reduced, so that the reliability of data read-out and write can be improved.

DETAILED DESCRIPTION OF THE INVENTION

Hereinafter, preferred examples of the present invention will be described with reference to the accompanying drawings.

FIRST EXAMPLE

Hereinafter, a semiconductor memory device of a first example of the present invention will be described with reference to FIG. 1.

Figure 1:
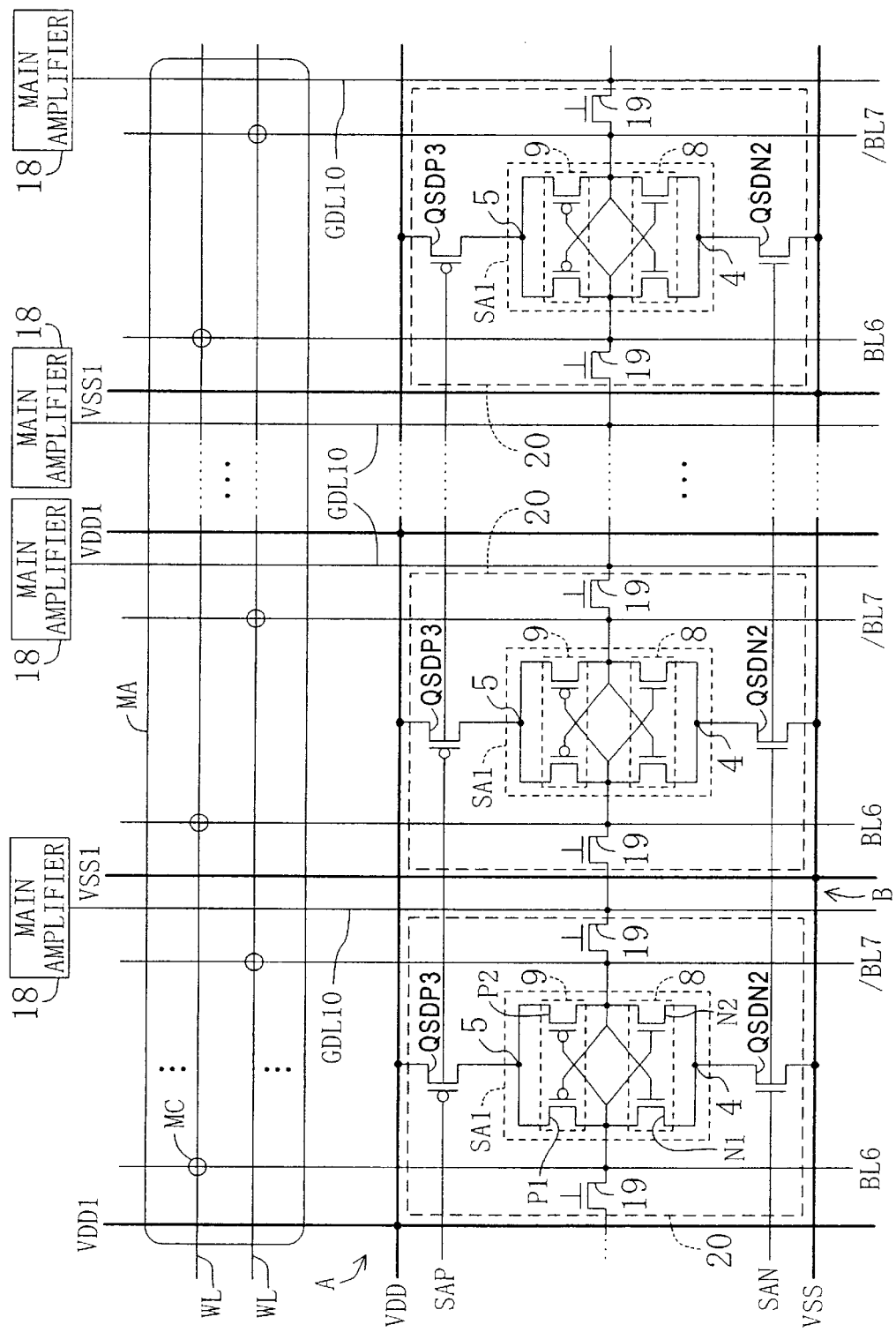
FIG. 1 is a circuit diagram illustrating a sense amplifier drive circuit that is the semiconductor memory device of a first example of the present invention.

FIG. 1 shows an individual sense amplifier drive circuit as a semiconductor memory device of this example. In FIG. 1, MA denotes a memory array in which multiple memory cells MC are arranged in an array. WL denotes a plurality of word lines that selects memory cells MC in the same row, and BL6 and /BL7 denotes bit lines connected to memory cells MC in the same column and provided as multiple pairs. SA is a plurality of sense amplifiers each of which is connected to a pair of bit lines BL6 and /BL7. A global data line GDL10 is connected to each of the sense amplifiers SA via a decoding switch 19. The global data line GDL10 is a wiring for connecting the bit line BL6 or /BL7 to a main amplifier 18 via a sense amplifier SA. The main amplifier 18 is an amplifier further amplifying data from bit lines BL6 and /BL7 that have been amplified by the sense amplifier SA.

The plurality of sense amplifiers SA1 are CMOS amplifiers each of which includes a PMOS amplifier 9 including two PMOS transistors P1 and P2, and an NMOS amplifier 8 including two NMOS transistors N1 and N2.

For every predetermined number (one in FIG. 1) of the plurality of CMOS sense amplifiers SA1, the drain of an NMOS sense amplifier drive transistor QSDN2 is connected to the source node 4 of the NMOS amplifier 8. On the other hand, the drain of a PMOS sense amplifier drive transistor QSDP3 is connected to the source node 5 of the PMOS amplifier 9. For each of the PMOS sense amplifier drive transistors QSDP3, its source is connected to a common power line (a first common power line) VDD that extends in the column direction of the sense amplifiers and has a predetermined potential. When a sense amplifier driving signal SAP is turned to a ground potential VSS, this source turns on so as to set the source node 5 of the corresponding PMOS amplifier 9 to a predetermined potential. On the other hand, for each of the NMOS sense amplifier drive transistors QSDN2, its source is connected to a common power line (a second common power line) VSS that extends in the column direction of the sense amplifiers and has a ground potential. When another sense amplifier driving signal SAN is turned to a predetermined potential VDD, this source turns on so as to set the source node 4 of the corresponding NMOS amplifier 8 to a ground potential.

Every two of the plurality of CMOS sense amplifiers SA1 has a first independent power line VDD1 having a predetermined potential and a second independent power line VSS1 having a ground potential that extend in the direction of the bit lines. More specifically, in the two CMOS sense amplifiers SA1 illustrated on the left side in FIG. 1, the first independent power line VDD1 having a predetermined potential extends on the left side of the left sense amplifier SA, and the second independent power line VSS1 having a ground potential extends on the left side of the right sense amplifier SA. These multiple first independent power lines VDD1 are connected to the first common power line VDD orthogonal thereto, and the multiple second independent power lines VSS1 are connected to the second common power line VSS orthogonal thereto. The total number of the first and the second independent power lines VDD1 and VSS1 is the same as the number of the CMOS sense amplifiers SA1 provided in one memory array MA.

The first common power line VDD and the multiple first independent power lines VDD1 constitute multiple first power lines A that supply a given power source to the plurality of CMOS sense amplifiers SA1 via respective PMOS sense amplifier drive transistors QSDP3, and the second common power line VSS and the multiple second independent power lines VSS1 constitute multiple second power lines B that supply a given power source to the plurality of CMOS sense amplifiers SA1 via respective NMOS sense amplifier drive transistors QSDN2.

Next, operations of an individual sense amplifier drive circuit of this example will be described. When a word line WL is activated, data with a small potential is read out from a memory cell MC into a bit line (e.g., BL6). Then, the bit line BL6 is charged from a precharge potential (a half of the potential of a given power source) to the potential of the given power source by the PMOS sense amplifier drive transistor QSDP3. At the same time, the other bit line /BL7 that makes a pair with the bit line BL6 is discharged from the precharge potential to a ground potential by the NMOS sense amplifier drive transistor QSDN2.

Herein, the NMOS amplifier 8 side will be described. Since the sources of the NMOS sense amplifier drive transistors QSDN2 are connected to the second common power line VSS and the multiple second independent power lines VSS1 that are orthogonal to the second common power line VSS, the discharging current to the ground is distributed and flows into these second power lines B that are formed in a mesh-like pattern and have a low impedance. As a result, floating (rise) of the source potential of the NMOS amplifier 8 is suppressed so that the conventional problem of the current capacity drop of the NMOS amplifier 108 due to the floating of the source potential of the NMOS sense amplifier 108 can be avoided. Therefore, the discharging time can be reduced and the sensing operation speed can be increased so that the time for reading data can be reduced.

Furthermore, conventionally, the discharging current flowed into the common sense amplifier driving line 104. Thus, when the potential of the common sense amplifier driving line 104 floated, this floating of the potential affected the source potentials of all the NMOS amplifiers 108, which causes variations in the sensing speed depending on non-uniformity in the threshold voltage of the NMOS amplifiers 108 or the pattern of data to be read out. In this example, however, since the charging and the discharging currents are distributed to multiple power lines VSS, VSS1, VDD and VDD1, interference between the plurality of sense amplifiers SA can be suppressed and a high-speed read-out operation can be realized.

Figure 2:
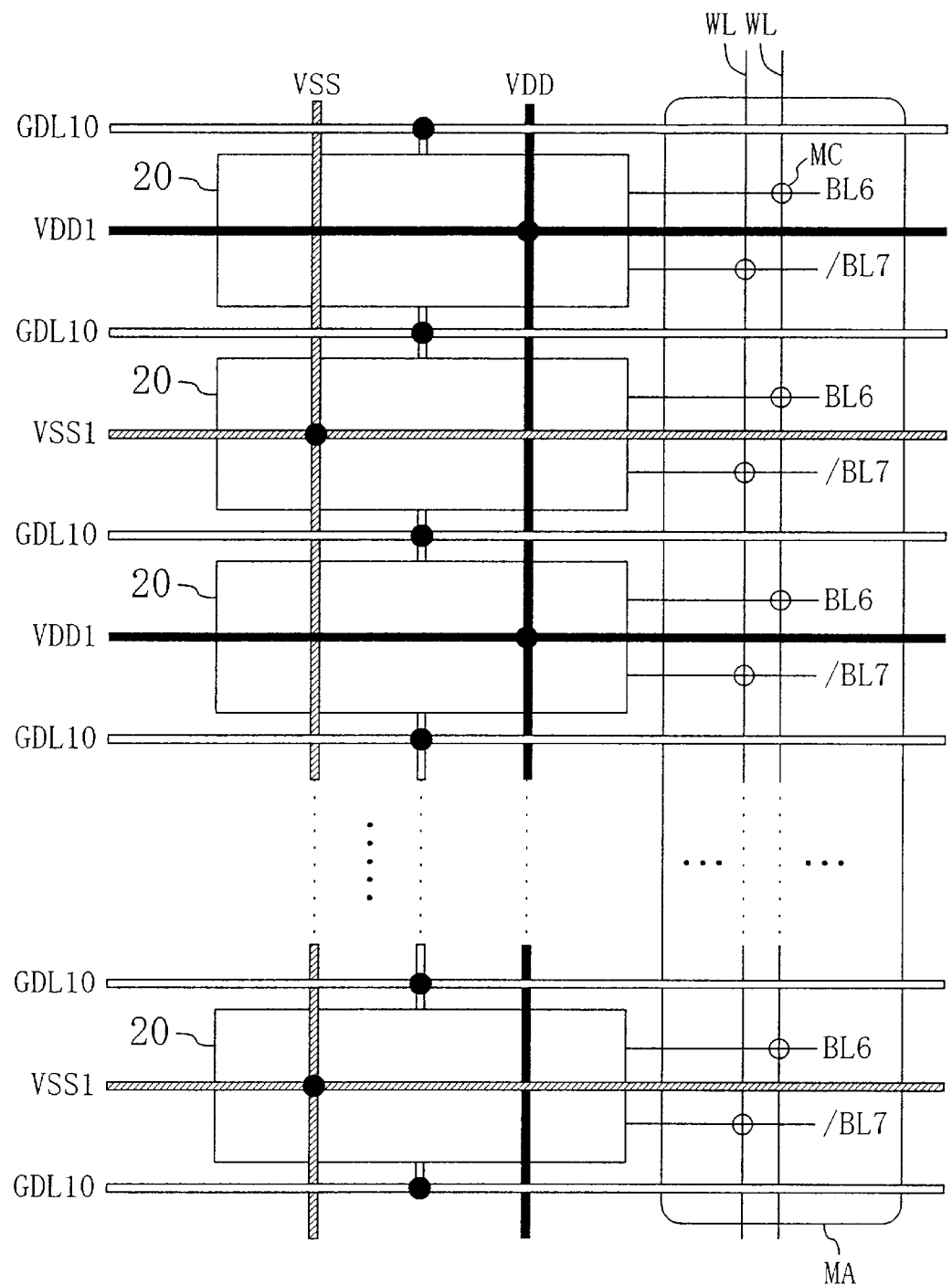
FIG. 2 is a schematic diagram illustrating a layout of the sense amplifier drive circuit of the first example.

FIG. 2 shows a schematic layout of the individual sense amplifier drive circuit of this example and mainly illustrates a layout of the power source lines. In FIG. 2, reference numeral 20 denotes a CMOS sense amplifier section that includes the sense amplifier SA1, two decoding switches 19 and two sense amplifier drive transistors QSDN2 and QSDP3 that are shown in FIG. 1. As shown in FIG. 2, the first and the second common power lines VDD and VSS extend in parallel with each other in the column direction of the sense amplifiers and are located above each CMOS sense amplifier section 20. The multiple first and second independent power lines VDD1 and VSS1 are arranged alternately in the column direction of the sense amplifiers, extend in the direction orthogonal to the common power lines VDD and VSS above the sense amplifier sections 20, and are arranged between a pair of bit lines BL6 and /BL7. Each global data line GDL10 is located between two adjacent sense amplifier sections 20. The first and the second independent power lines VDD1 and VSS1 are arranged alternately above the sense amplifier sections 20. As a result, each global data line GDL10 is located between the first independent power line VDD1 and the second independent power line VSS1. In FIG. 2, the word lines WL extending in the longitudinal direction of FIG. 2 and the common power lines VDD and VSS are wired in a first aluminum wiring layer, and the independent power lines VDD1 and VSS1 extending in the lateral direction and the global data lines GDL10 are wired in a second aluminum wiring layer.

Therefore, the global data line GDL10 is shielded by the first and the second independent power lines VDD1 and VSS1 that run in parallel with this global data line GDL10. Therefore, noise due to interference between the global data lines GDL10 can be suppressed to be small so that the possibility of reading out or writing data erroneously can be reduced.

The number of the multiple first and second independent power lines is not limited to that used in this example and an be determined from the viewpoint of realizing a high-speed sensing operation by effectively suppressing interference between the sense amplifiers SA1.

SECOND EXAMPLE

Next, an individual sense amplifier drive circuit as a semiconductor memory device of a second example of the present invention will be described.

Figure 3:
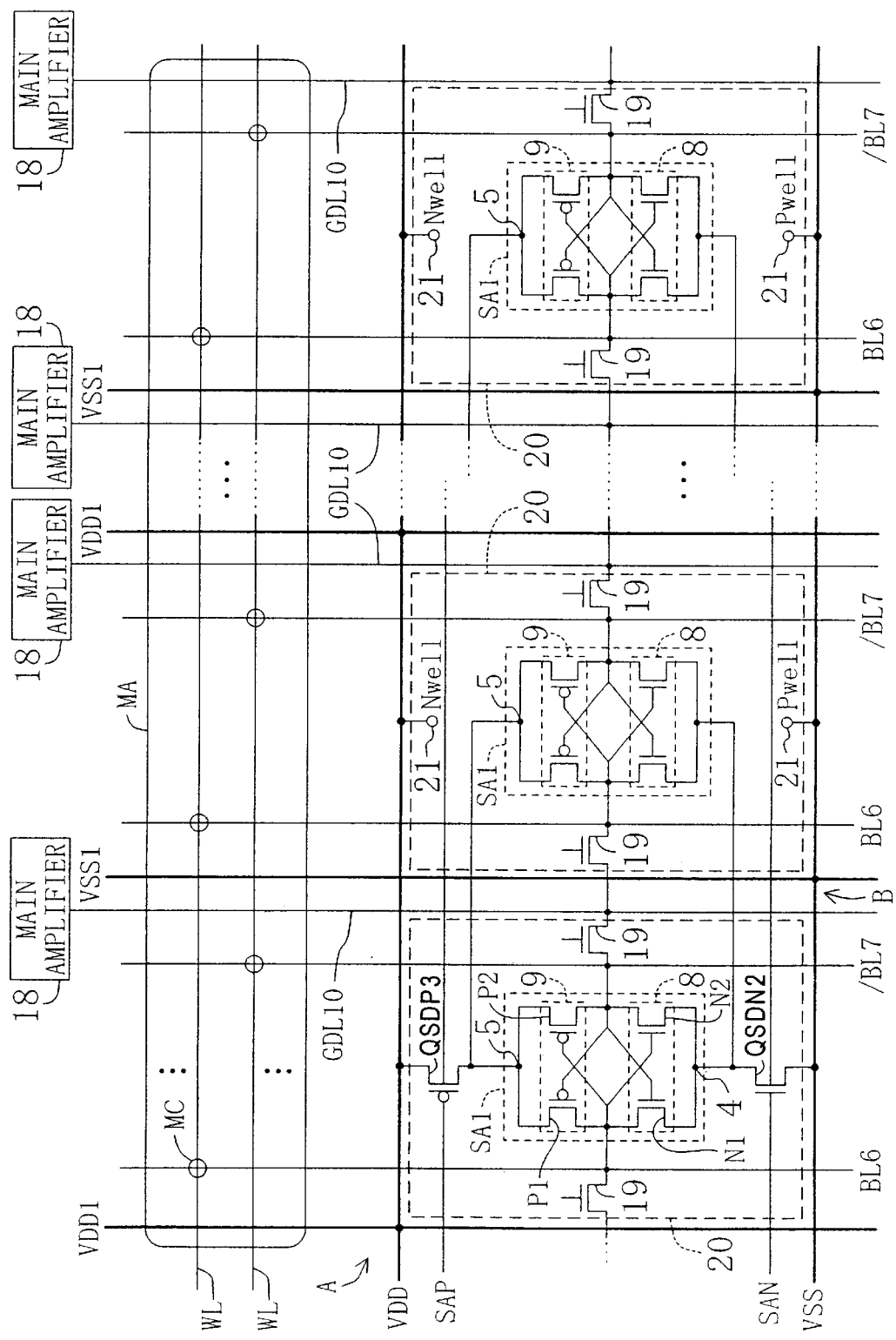
FIG. 3 is a circuit diagram illustrating a sense amplifier drive circuit of a second example of the present invention.

FIG. 3 shows an individual sense amplifier driving circuit of this example. In this example, instead of arranging the PMOS and the NMOS sense amplifier drive transistors QSDP3 and QSDN2 in each CMOS sense amplifier SA, they are shared by two CMOS sense amplifiers SA.

In other words, for example, in the two CMOS sense amplifiers SA illustrated on the left side in FIG. 3, the PMOS and the NMOS sense amplifier drive transistors QSDP3 and QSDN2 are arranged in the CMOS sense amplifier SA located on the left side, as in the first example. On the other hand, in the CMOS sense amplifier SA located on the right side in FIG. 3, the respective source nodes 4 and 5 of the NMOS and the PMOS amplifiers 8 and 9 thereof are connected to the source nodes 4 and 5 of the CMOS sense amplifier SA located on the right side. Then, in the CMOS sense amplifier SA located on the right side in FIG. 3, a substrate contact 21 that connects the first common power line VDD to an N-type substrate and a substrate contact 21 that connects the second common power line VSS to a P-type well are formed in vacant areas where the PMOS and the NMOS sense amplifier drive transistors QSDP3 and QSDN2 are not arranged, respectively. Thus, the resistance value of these common lines VDD and VSS with respect to the substrate and the well can be reduced. Herein, the substrate contact also includes connecting the power line to the well as described above, in addition to connecting the power line to the substrate.

Therefore, in this example, an additional area for forming a substrate contact is unnecessary and a compact layout can be obtained because the sense amplifier drive transistors QSDP3 and QSDN2 are shared, so that vacant areas where these transistors are not arranged are effectively utilized to form the substrate contact 21 for the common power lines.

THIRD EXAMPLE

Next, an individual sense amplifier drive circuit as a semiconductor memory device of a third example of the present invention will be described with reference to FIGS. 4 and 5. This example is provided with a first power line and a second power line that are used exclusively for every predetermined small number (e.g., two) of CMOS sense amplifiers SA.

Figure 4:
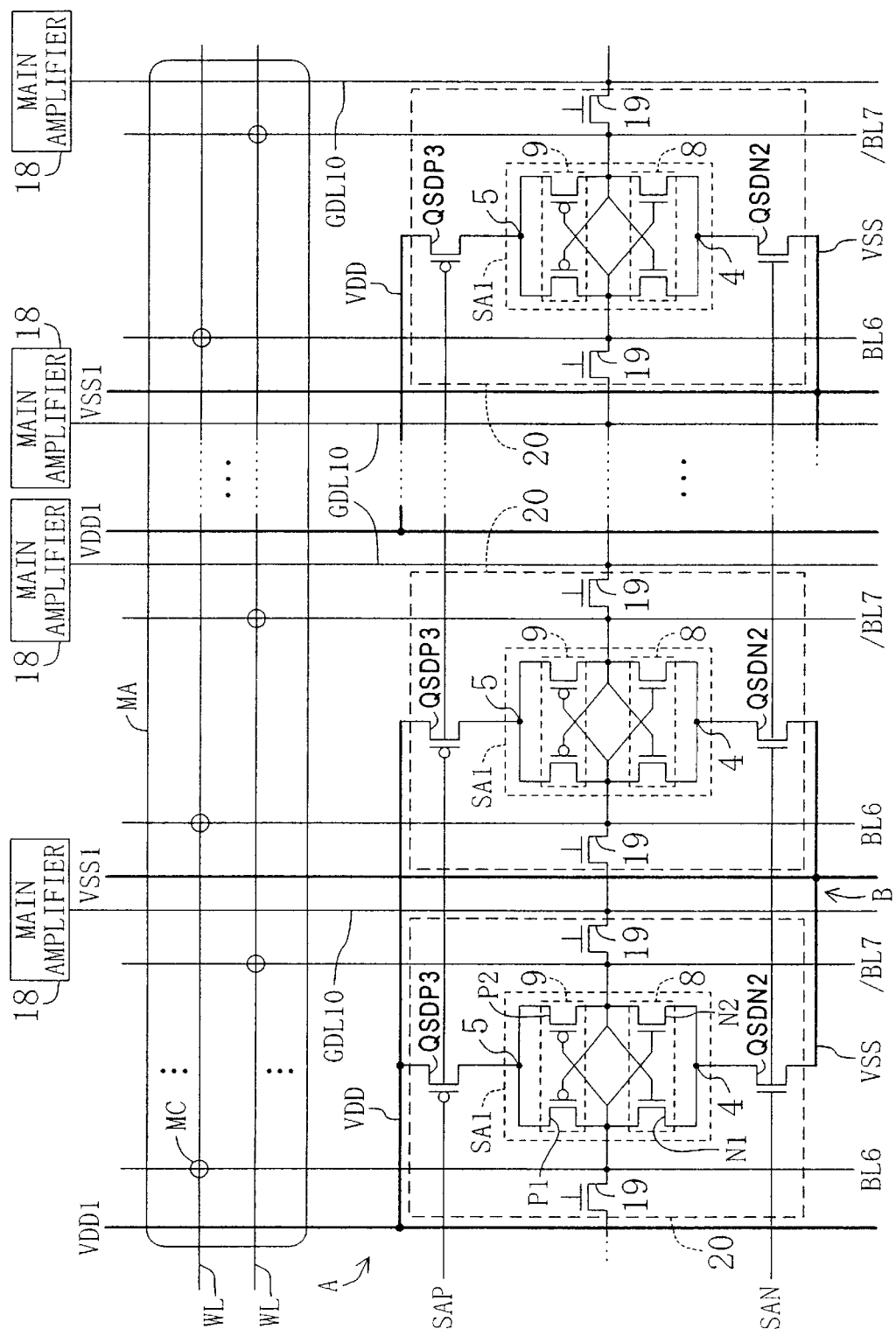
FIG. 4 is a circuit diagram illustrating a sense amplifier drive circuit of a third example of the present invention.
Figure 5:
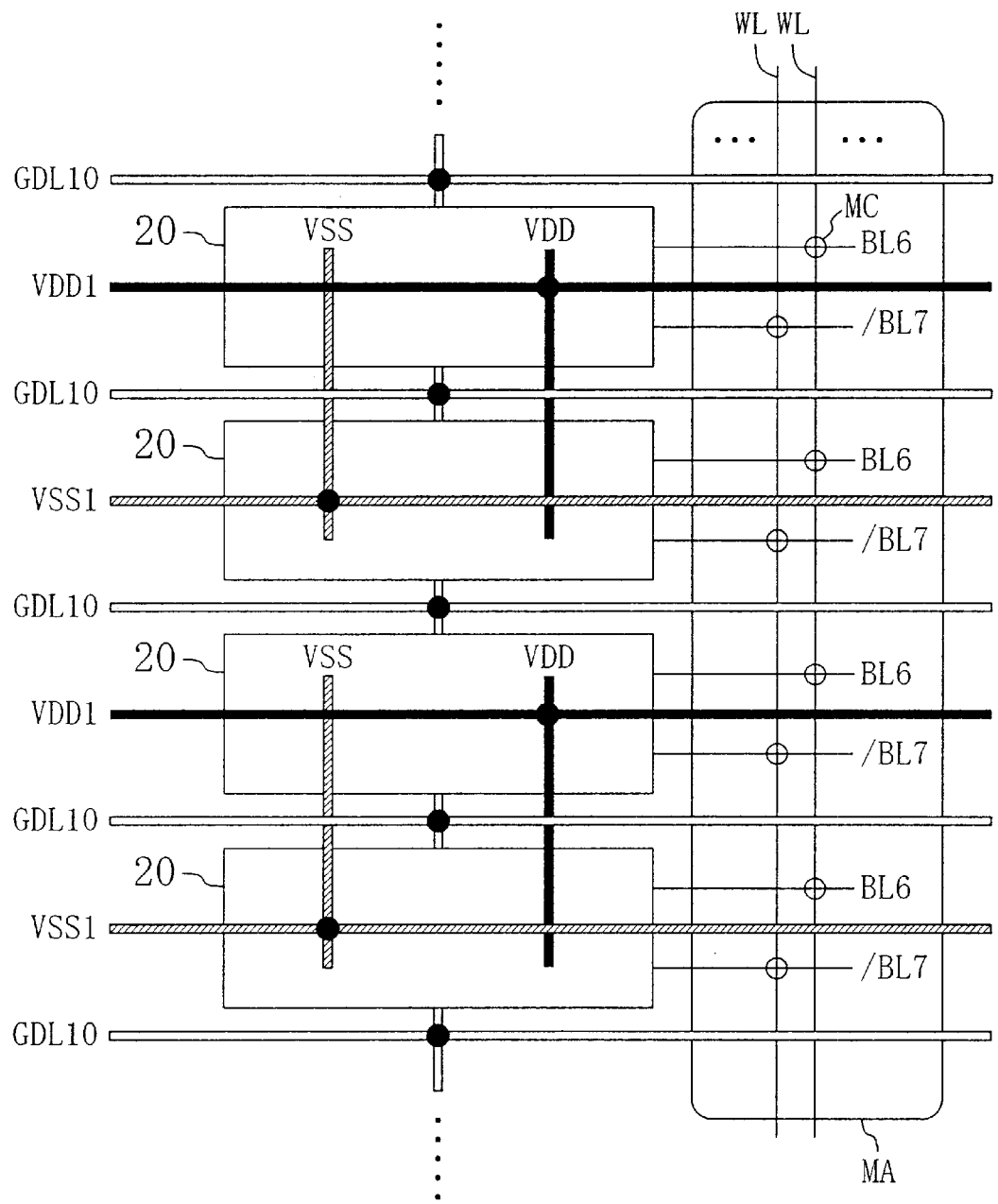
FIG. 5 is a schematic diagram illustrating a layout of the sense amplifier drive circuit of the third example.
Figure 6:
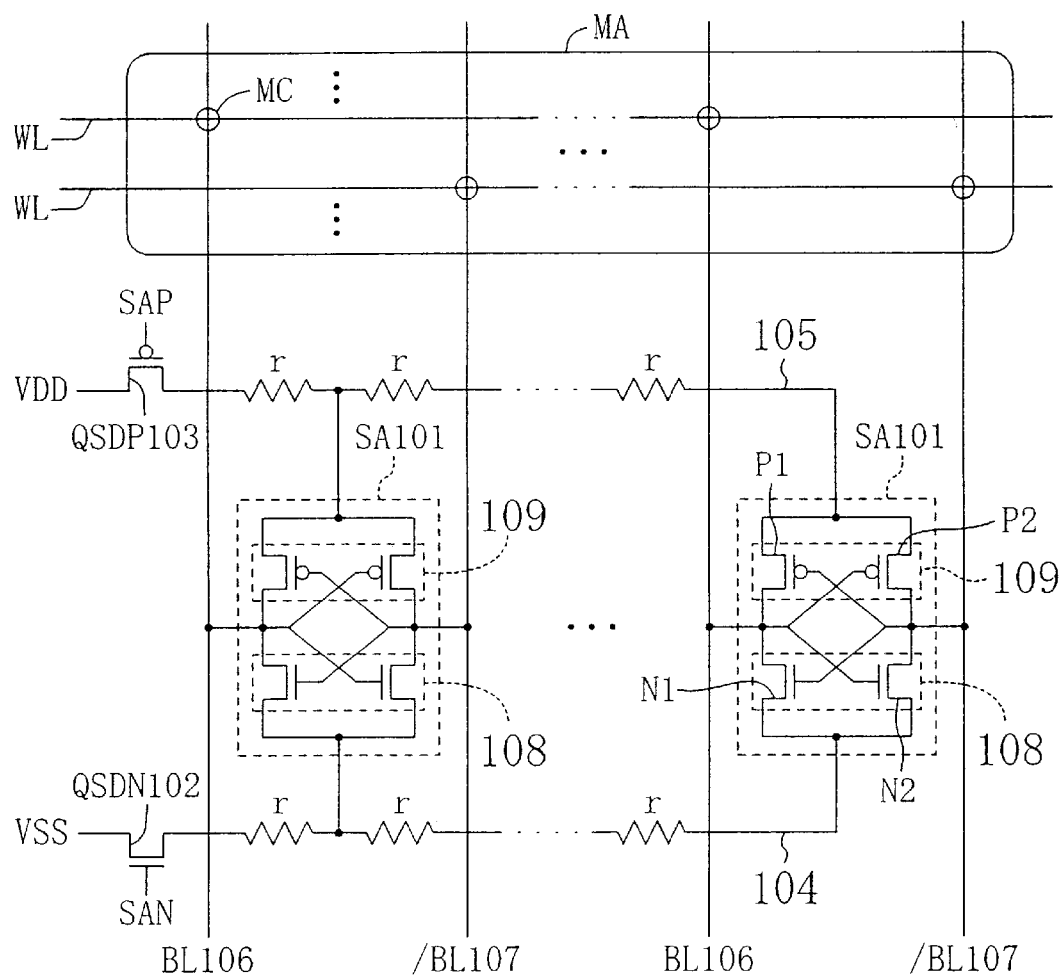
FIG. 6 is a circuit diagram illustrating a conventional sense amplifier drive circuit.

In other words, in FIGS. 4 and 5, the first and the second common power lines VDD and VSS extending in the sense amplifier column direction are disconnected for every two sense amplifiers SA1 so that one independent power line VDD1 and one independent power line VSS1 are used exclusively for the two adjacent sense amplifiers SA1. In this example, the charging current is supplied from the exclusively used first independent power line VDD to the corresponding two sense amplifiers SA via the disconnected power line VDD. The discharging current from the two sense amplifiers SA flows to the ground via the disconnected power line VSS and the second independent power line VSS1 exclusively used.

Therefore, in this example, the first independent power line VDD1 exclusively used and the second independent power line VSS1 exclusively used are provided for every two of the CMOS sense amplifiers SA, so that the charging and the discharging currents of the sense amplifiers can be separated for every two of the sense amplifiers SA.

Therefore, the degree that a set of two sense amplifiers SA interferes with other sets of sense amplifiers SA can be minimized so that the data read-out and write speed can be increased.

As shown in FIG. 5, in this example as well as in the first example, the first and the second independent power lines VDD1 and VSS1 are arranged above the sense amplifiers SA and the global data line GDL is located between the two sense amplifiers SA. Thus, the global data line GDL is located between the first and the second independent power lines VDD1 and VSS1 that extend in parallel with this data line, and shielded by the two power lines VDD1 and VSS1.

Therefore, noise due to interference between the global data lines GDL10 can be suppressed to be small so that the possibility of reading out or writing data erroneously can be reduced.

The number of the sense amplifiers SA1 that use exclusively the same independent power lines VDD1 and VSS1 is not limited to two as in this example and can be set to a suitable predetermined small number such as three or four, in view of effectively suppressing interference between the sense amplifiers SA1.

What is claimed is:

1. A semiconductor memory device comprising:
   a plurality of CMOS sense amplifiers each of which includes both PMOS and NMOS transistors;
   a PMOS sense amplifier drive transistor that is provided for every predetermined number of the plurality of CMOS sense amplifiers, connected to sources of PMOS transistors of the corresponding predetermined number of the CMOS sense amplifiers and driven by a sense amplifier driving signal;
   an NMOS sense amplifier drive transistor that is provided for every predetermined number of the plurality of CMOS sense amplifiers, connected to sources of NMOS transistors of the corresponding predetermined number of the CMOS sense amplifiers and driven by another sense amplifier driving signal;
   multiple first independent power lines for supplying a given power source to the plurality of CMOS sense amplifiers through the respective PMOS sense amplifier drive transistors;
   multiple second independent power lines for supplying another given power source to the plurality of CMOS sense amplifiers through the respective NMOS sense amplifier drive transistors; and
   a plurality of global data lines respectively coupled to the plurality of CMOS sense amplifiers via a plurality of decoding switches for transferring data signals amplified by the plurality of CMOS sense amplifiers to a plurality of main amplifiers, each of the plurality of global data lines being disposed between adjacent ones of the multiple first independent power lines and the multiple second independent power lines.

2. The semiconductor memory device according to claim 1, wherein
   one PMOS and one NMOS sense amplifier drive transistors are provided for every two of the CMOS sense amplifiers.

3. The semiconductor memory device according to claim 2, wherein
   each of the PMOS and the NMOS sense amplifier drive transistors is shared by every two of the CMOS sense amplifiers, and
   a substrate contact for connecting the first and the second power lines to a substrate is formed near one of the two CMOS sense amplifiers in an area where the sense amplifier drive transistors are not arranged.

4. The semiconductor memory device according to claim 1, further comprising:
   a first common power line extending in a column direction of the CMOS sense amplifiers, the first common power line being interposed between the multiple first independent power lines and the PMOS sense amplifier drive transistors; and
   a second common power line extending in a column direction of the CMOS sense amplifiers, the second common power line being interposed between the multiple second independent power lines and the NMOS sense amplifier drive transistors.

5. The semiconductor memory device according to claim 1, further comprising:
   a plurality of first exclusive power lines each interposed between a corresponding one of the plurality of the multiple first independent power lines and corresponding ones of the plurality of CMOS sense amplifiers, the exclusive first power lines being mutually electrically isolated; and
   a plurality of second exclusive power lines each interposed between a corresponding one of the plurality of the multiple second independent power lines and corresponding ones of the plurality of CMOS sense amplifiers, the exclusive second power lines being mutually electrically isolated.

6. The semiconductor memory device according to claim 1, wherein:
   one of the multiple first independent power lines and one of the multiple second independent power lines are provided for every two of the CMOS sense amplifiers.

7. The semiconductor memory device according to claim 1, wherein:
   the multiple independent first power lines, the multiple independent second power lines and the plurality of global data lines are all formed in a common wiring layer.

8. A semiconductor memory device comprising:
   a plurality of CMOS sense amplifiers each of which includes both PMOS and NMOS transistors;
   a PMOS sense amplifier drive transistor that is provided for every predetermined number of the plurality of CMOS sense amplifiers, connected to sources of PMOS transistors of the corresponding predetermined number of the CMOS sense amplifiers and driven by a sense amplifier driving signal;
   an NMOS sense amplifier drive transistor that is provided for every predetermined number of the plurality of CMOS sense amplifiers, connected to sources of NMOS transistors of the corresponding predetermined number of the CMOS sense amplifiers and driven by another sense amplifier driving signal;
   multiple first independent power lines for supplying a given power source to the plurality of CMOS sense amplifiers through the respective PMOS sense amplifier drive transistors;
   multiple second independent power lines for supplying another given power source to the plurality of CMOS sense amplifiers through the respective NMOS sense amplifier drive transistors;
   a plurality of first exclusive power lines each interposed between a corresponding one of the plurality of the multiple first independent power lines and corresponding ones of the plurality of CMOS sense amplifiers, the exclusive first power lines being mutually electrically isolated; and a plurality of second exclusive power lines each interposed between a corresponding one of the plurality of the multiple second independent power lines and corresponding ones of the plurality of CMOS sense amplifiers, the exclusive second power lines being mutually electrically isolated.

9. The semiconductor memory device according to claim 12, wherein:

each of the plurality of first exclusive power lines is coupled to a predetermined number of the plurality of CMOS sense amplifiers, and each of the plurality of second exclusive power lines is coupled to said predetermined number of the plurality of CMOS sense amplifiers.

10. The semiconductor memory device according to claim 9, wherein said predetermined number is two.

* * * * *

UNITED STATES PATENT AND TRADEMARK OFFICE
CERTIFICATE OF CORRECTION

PATENT NO. : 6,483,763 B2
DATED : November 19, 2002
INVENTOR(S) : Toshitaka Uchikoba et al.

It is certified that error appears in the above-identified patent and that said Letters Patent is hereby corrected as shown below:

<u>Column 11,</u>
Line 11, change "12" to -- 8 --

Signed and Sealed this

Third Day of June, 2003

JAMES E. ROGAN
*Director of the United States Patent and Trademark Office*